US008080731B2

(12) United States Patent
Grip

(10) Patent No.: US 8,080,731 B2
(45) Date of Patent: Dec. 20, 2011

(54) RESTRAINED SOLAR COLLECTOR AND METHOD

(75) Inventor: Robert E. Grip, Rancho Palos Verdes, CA (US)

(73) Assignee: The Boeing Company, Chicago, IL (US)

( * ) Notice: Subject to any disclaimer, the term of this patent is extended or adjusted under 35 U.S.C. 154(b) by 605 days.

(21) Appl. No.: 11/764,038

(22) Filed: Jun. 15, 2007

(65) Prior Publication Data
US 2008/0308153 A1 Dec. 18, 2008

(51) Int. Cl.
*H01L 31/00* (2006.01)
*H01L 23/34* (2006.01)
*H01J 7/24* (2006.01)

(52) U.S. Cl. ........ 136/259; 136/246; 136/248; 136/251; 250/238; 257/712

(58) Field of Classification Search ............... 136/246, 136/259, 248, 251; 250/238; 257/712
See application file for complete search history.

(56) References Cited

U.S. PATENT DOCUMENTS

| 2,702,989 A | * | 3/1955 | Pagendarm | 431/37 |
| 3,280,849 A | * | 10/1966 | Rendos et al. | 138/149 |
| 3,750,747 A | * | 8/1973 | Hingorany | 165/178 |
| 3,850,236 A | * | 11/1974 | O'Connor et al. | 165/181 |
| 4,056,405 A | * | 11/1977 | Varadi | 136/246 |
| 4,152,175 A | * | 5/1979 | Burgess et al. | 136/259 |
| 4,166,917 A | * | 9/1979 | Dorfeld et al. | 136/259 |
| 4,393,393 A | | 7/1983 | Allen, Jr. et al. | |
| 4,464,333 A | * | 8/1984 | Wohlsen | 376/280 |
| 4,830,678 A | * | 5/1989 | Todorof et al. | 136/259 |
| 6,075,701 A | | 6/2000 | Ali et al. | |
| 6,323,416 B1 | * | 11/2001 | Komori et al. | 136/259 |
| 6,345,507 B1 | * | 2/2002 | Gillen | 62/3.7 |
| 7,208,674 B2 | * | 4/2007 | Aylaian | 136/251 |
| 2003/0047208 A1 | * | 3/2003 | Glenn et al. | 136/246 |
| 2003/0089391 A1 | * | 5/2003 | Fukudome et al. | 136/227 |

FOREIGN PATENT DOCUMENTS
JP 2-187058 * 7/1990
JP 02178992 A * 7/1990

OTHER PUBLICATIONS

Cao et al. "Ceramic materials for thermal barrier coatings" J. of European Ceramic Society 24, Dec. 2004 1-10.*
Asai, et al. JP02178992A, Jul. 11, 1992, Derwent Abstract.*

* cited by examiner

Primary Examiner — Basia Ridley
Assistant Examiner — Devina Pillay
(74) Attorney, Agent, or Firm — Klintworth & Rozenblat IP LLC

(57) ABSTRACT

In one embodiment, a solar collector comprises a solar cell attached with a heat exchanger, and a restraining member attached to the heat exchanger. The restraining member at least partly restrains the heat exchanger when heated. In further embodiments, restraining members and methods are disclosed for at least partly restraining the thermal expansion of a solar collector.

28 Claims, 7 Drawing Sheets

RESTRAINED SOLAR COLLECTOR AND METHOD

BACKGROUND

Many solar collectors exist today. Solar collectors are often used to turn solar radiation into electricity. In one existing solar collector, the solar collector includes a reflective surface, a germanium solar cell, and a copper heat exchanger comprising a baseplate and an attached heat pipe. The solar cell may be attached to the baseplate of the heat exchanger through various means. The reflective surface reflects sun rays to the solar cell which turns the sun rays into electricity. When the solar cell becomes hot, the excess heat is transferred to the baseplate of the heat exchanger and transferred to the ambient atmosphere through the heat pipe. During this time, the copper baseplate thermally expands more than the germanium solar cell. This may lead to increased tensile stress in the solar cell which may cause the solar cell to separate from the baseplate, to fracture, or to experience one or more other types of problems.

In another existing solar collector, the solar cell may be adhered to the baseplate using a poor conductive, thermal adhesive. When excess heat from the solar cell is transferred to the baseplate, the poor conductive, thermal adhesive may cause ineffective thermal conductivity resulting in a higher temperature difference between the solar cell and the baseplate. This may result in a larger heat sink area, and higher solar cell temperatures, which may reduce solar cell reliability and/or cause one or more other types of problems.

A solar collector, restraining member, and/or method for restraining the thermal expansion of a solar collector is needed to decrease one or more problems associated with one or more of the existing devices and/or methods.

SUMMARY

In one aspect of the disclosure, a solar collector comprises a solar cell attached with a heat exchanger, and a restraining member attached to the heat exchanger. The restraining member at least partly restrains the heat exchanger when heated.

In another aspect of the disclosure, a restraining member is provided for attaching to a heat exchanger of a solar collector. The restraining member at least partly restrains thermal expansion of the heat exchanger when heated.

In a further aspect of the disclosure, a method is disclosed of at least partly restraining thermal expansion of a solar collector. In one step, a solar collector is provided which comprises a solar cell attached with a heat exchanger, and a restraining member attached to the heat exchanger. In another step, the heat exchanger is heated. In still another step, thermal expansion of the heat exchanger is at least partly restrained with the restraining member.

These and other features, aspects and advantages of the disclosure will become better understood with reference to the following drawings, description and claims.

DETAILED DESCRIPTION

The following detailed description is of the best currently contemplated modes of carrying out the disclosure. The description is not to be taken in a limiting sense, but is made merely for the purpose of illustrating the general principles of the disclosure, since the scope of the disclosure is best defined by the appended claims.

Figure 1:
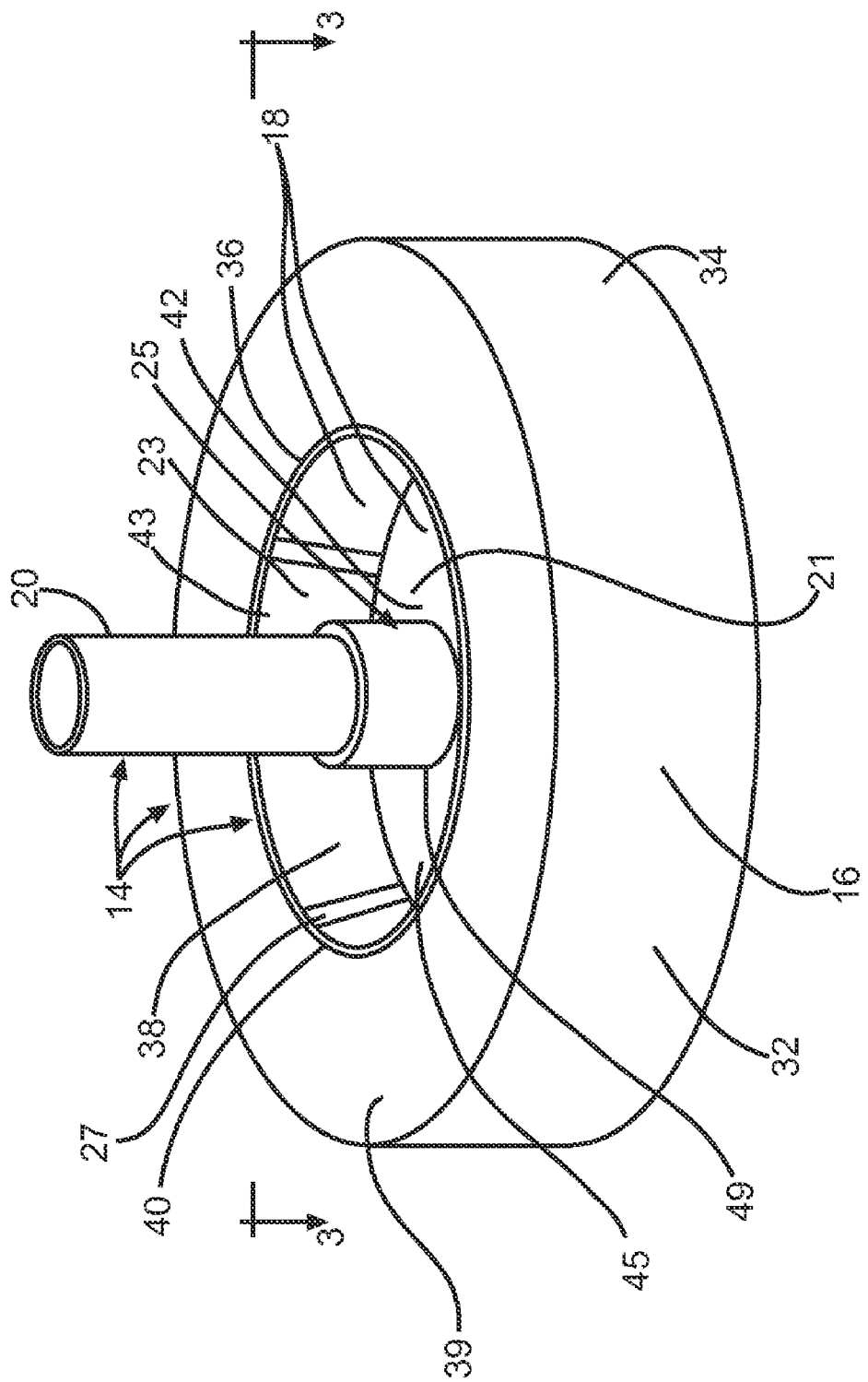
FIG. 1 shows a top perspective view of one embodiment of a solar collector.
Figure 2:
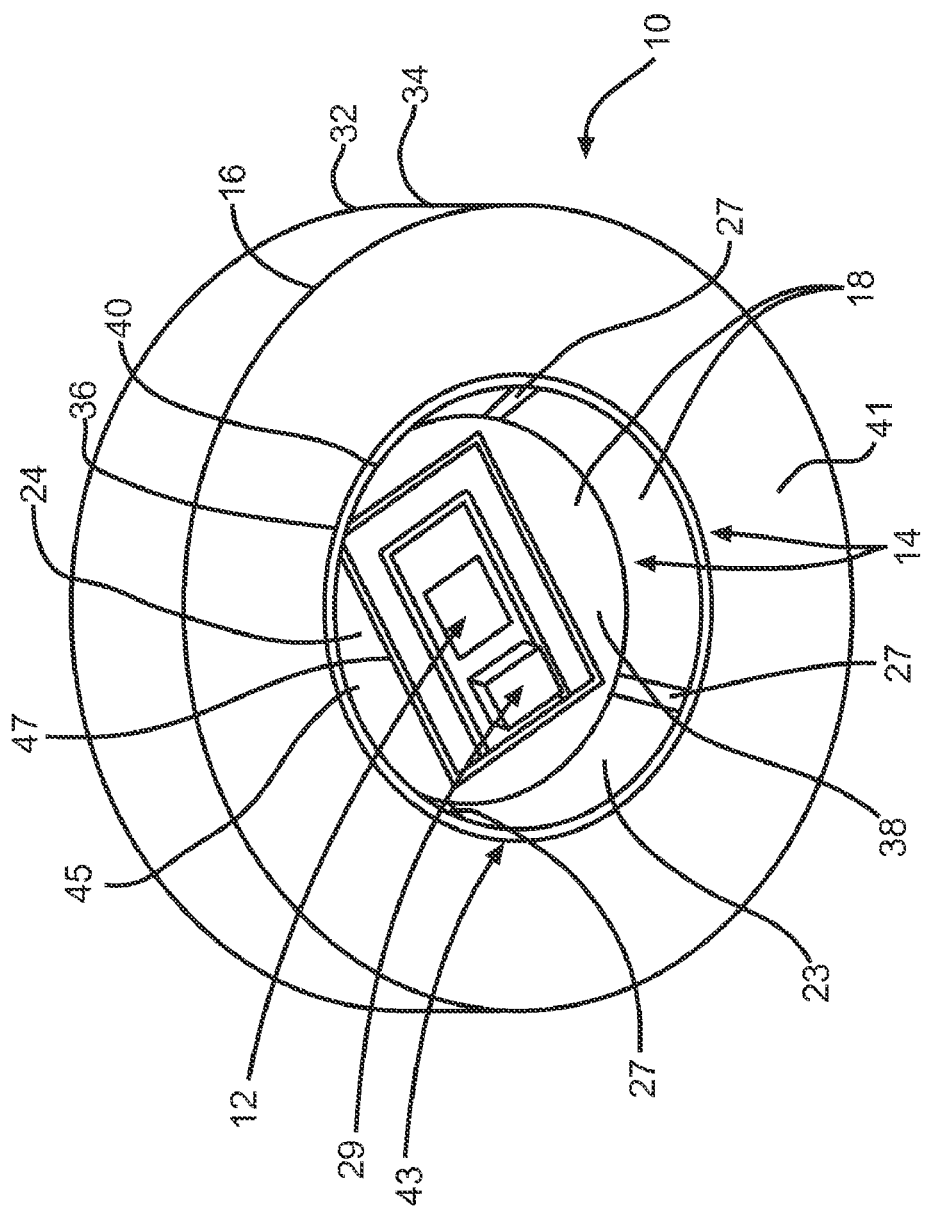
FIG. 2 shows a bottom perspective view of the solar collector of FIG. 1.
Figure 3:
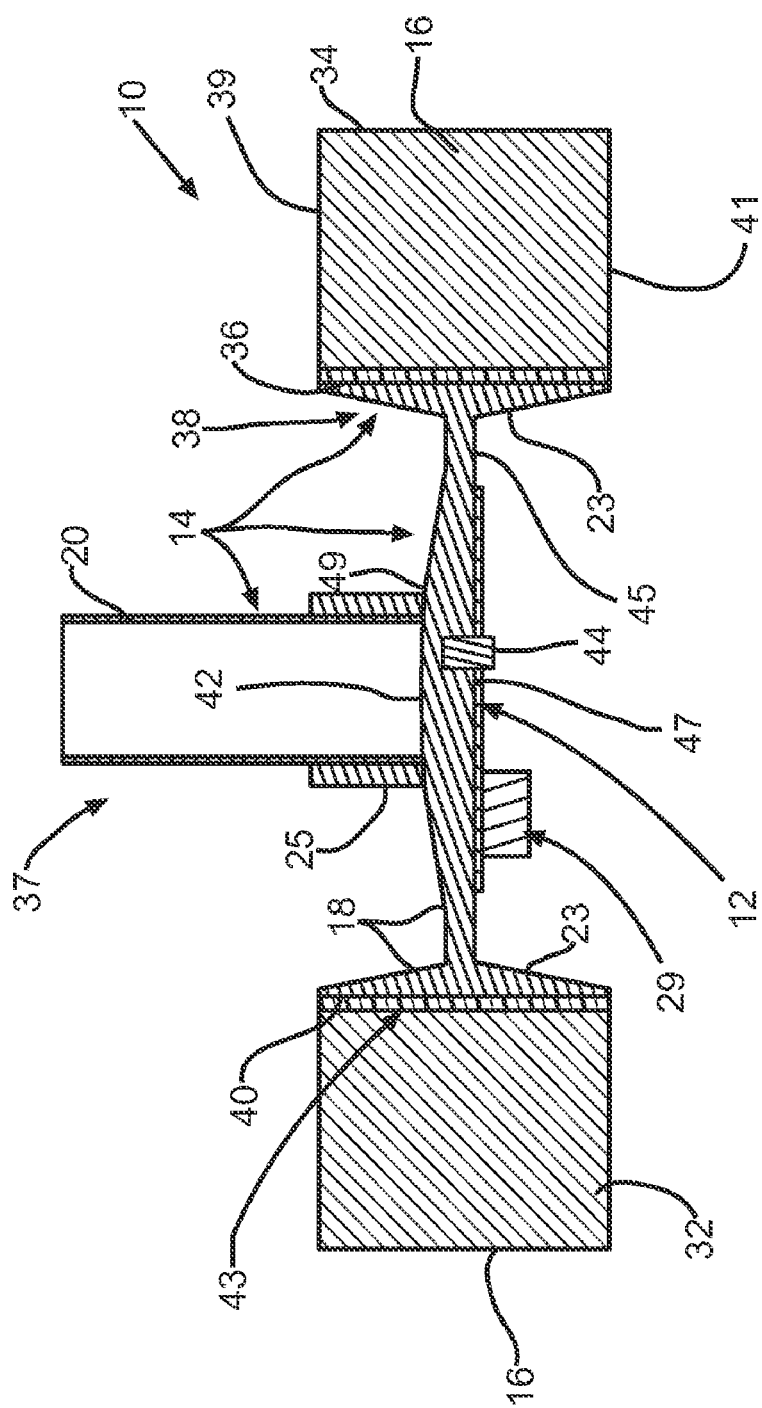
FIG. 3 shows a cross-section view through line 3-3 of the solar collector of FIG. 1.
Figure 4:
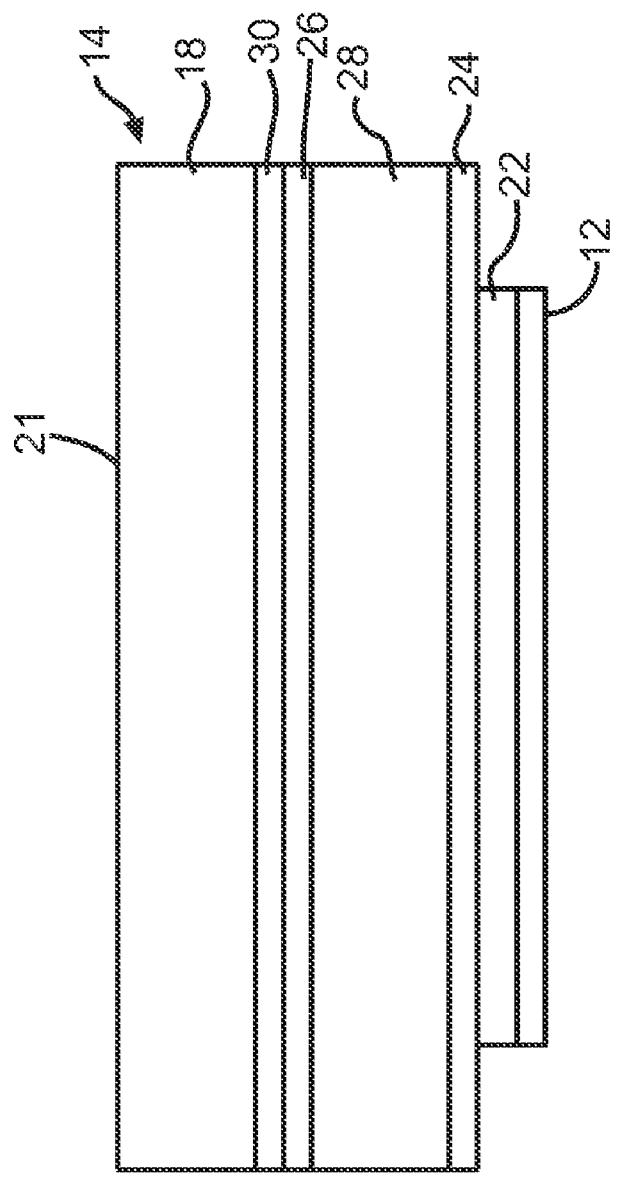
FIG. 4 shows an exploded view within rectangle 4-4 of the solar collector of FIG. 3.

FIG. 1 shows a top perspective view of one embodiment of a solar collector 10 which may be adapted to turn heat from the sun into electricity. FIG. 2 shows a bottom perspective view of the solar collector 10 of FIG. 1. FIG. 3 shows a cross-section view through line 3-3 of the solar collector 10 of FIG. 1. FIG. 4 shows an exploded view within rectangle 4-4 of the solar collector 10 of FIG. 3. As shown in FIGS. 1-4, the solar collector 10 may comprise a solar cell 12, a heat exchanger 14, and a restraining member 16. The heat exchanger 14 may be copper and may comprise a copper baseplate 18 and a substantially circular, copper heat pipe 20 extending from the baseplate 18. The baseplate 18 may comprise a circular inner surface 21 and an outer surface 23 extending substantially perpendicularly away from the inner surface 21. The outer surface 23 may not be continuous and may have one or more openings 27 spaced around the outer surface 23. In one embodiment, four openings 27 may be spaced uniformly around the outer surface 23. The openings 27 may alter the stress distribution in the baseplate 18 and restraining member 16, and may prevent the baseplate 18 from developing hoop compression. Otherwise, the portion 23 of the baseplate 18 may provide substantial resistance to the restraining member 16. In other embodiments, the outer surface 23 may be continuous without any openings 27. A substantially circular, copper collar 25 may attach the heat pipe 20 to the baseplate 18. In other embodiments, the heat exchanger 14 may comprise parts which are of varied numbers, types, configurations, sizes, and orientations.

The solar cell 12 may be made of germanium and may be attached with the baseplate 18 of the heat exchanger 14. In other embodiments, the solar cell 12 may be made of differing materials having differing rates of expansion. The solar cell 12 may be soldered at a solder layer 22 to a metal layer 24, which may comprise copper or other type of metal. The metal layer 24 may be deposited onto a substrate layer 28, which may comprise an Alumina substrate or other type of substrate. A diode 29 may be attached to the substrate layer 28. Another metal layer 26 may be deposited onto the substrate layer 28. The metal layer 26 may be soldered at yet another solder layer 30 to the baseplate 18 of the heat exchanger 14. The restraining member 16 may comprise a circular girdle member 32 having an exterior surface 34, an interior surface 36 defining an inner hole 38, a top surface 39, and a bottom surface 41. The interior surface 36 of the restraining member 16 may be attached over a perimeter 40 of the baseplate 18 of the heat exchanger 14.

When the solar cell 12 collects solar rays from the sun, the solar cell 12 may pass excess heat through the heat pipe 20 of the heat exchanger 14 to the ambient atmosphere 37. The restraining member 16 may be attached to the outer surface 23 of the baseplate 18 of the heat exchanger 14 through an epoxy layer 43, and may be adapted to at least partly restrain the heat exchanger 14 from expanding when heated. Preferably, the restraining member 16 is adapted to restrain the heat exchanger 14 enough so that the heat exchanger 14 expands a substantially same amount as the solar cell 12 when heated. For instance, the restraining member 16 may be adapted, upon the application of heat, to restrain a copper heat exchanger 14 enough so that it expands substantially the same amount as the germanium solar cell 12, which has a substantially slower rate of thermal expansion. In such manner, upon being heated, the heat exchanger 14 may expand a substantially same amount as the solar cell 12, thereby lessening the likelihood that the solar cell 12 will separate from the heat exchanger 14, experience fracture, or have other types of problems due to varying rates of expansion.

Use of the restraining member 16 may allow for the use of solder, which is a highly conductive material but also highly stiff, to connect the solar cell 12 to the baseplate 18 without breaking the solar cell 12. In other embodiments, use of the restraining member 16 may allow for the use of other highly conductive, highly stiff materials to connect the solar cell 12 to the heat exchanger 14 without breaking the solar cell.

The restraining member 16 may be made of FeNi36 (Invar®), steel, a nickel alloy, a carbon composite, and/or other type of material of substantially high stiffness and a substantially low coefficient of thermal expansion which may at least partly restrain the heat exchanger 14 from expanding when heated. In another embodiment, the restraining member 16, with a higher coefficient of thermal expansion, may at least partially restrain the heat exchanger 14 by means of being substantially cooler than the solar cell 12 and heat exchanger 14. The restraining member 16 may be cooler than the solar cell 12 and heat exchanger 14 simply due to the thermal characteristics of the design, or the restraining member 16 may be cooled by a cooling device. In other embodiments, the restraining member 16 may be of different sizes, different materials, different types, different orientations, and/or of different configurations, and may be attached to the heat exchanger 14 through varying mechanisms. For instance, in other embodiments, the restraining member 16 may be square, octagonal, or in other shapes or sizes.

Figure 5:
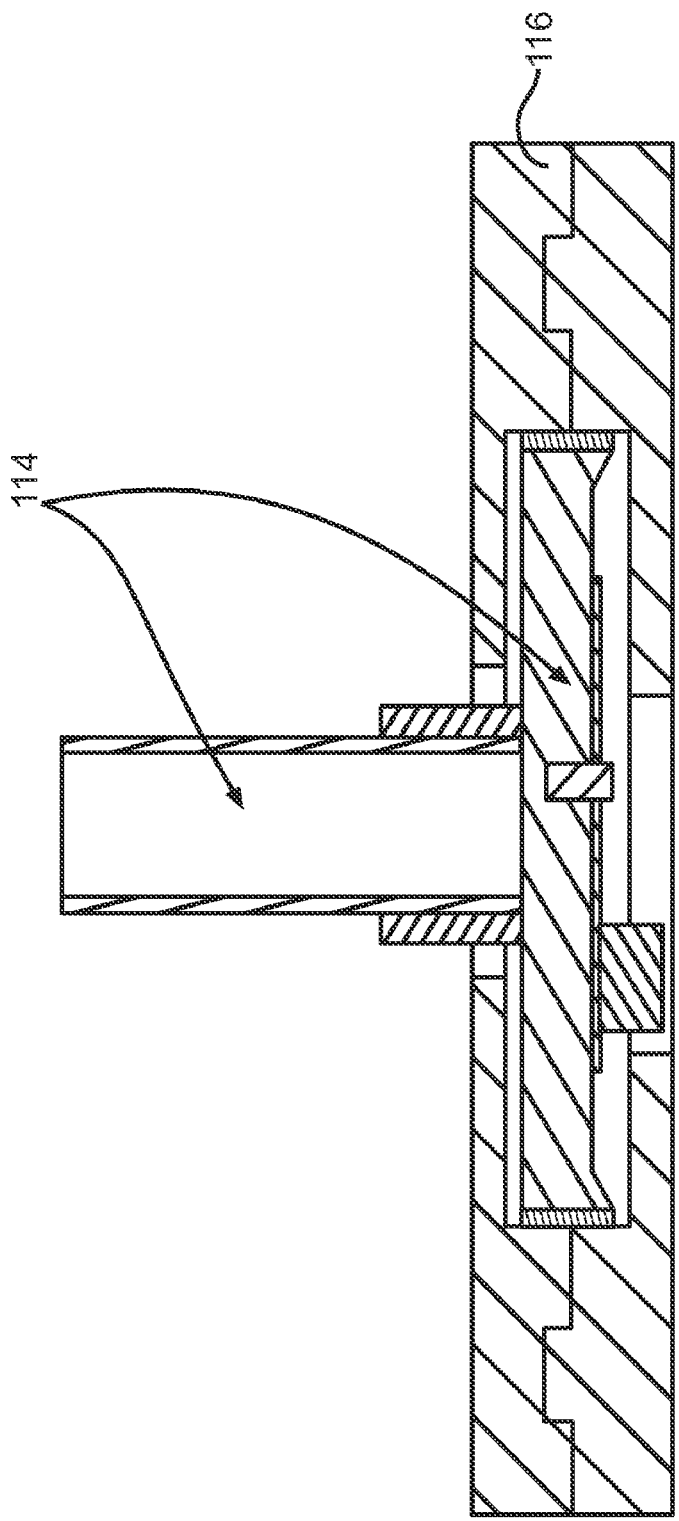
FIG. 5 shows a cross-section view of another embodiment of a solar collector.

In other embodiments, the restraining member 16 may be of a different size, shape, and orientation, and may be attached to any portion of the heat exchanger 14, yet still be adapted to restrain the heat exchanger 14. For instance, in one embodiment, the restraining member 16 may be in a non-circular shape, and may be attached to a non-perimeter surface of any portion of the heat exchanger 14 such as to a top or bottom portion of the heat exchanger 14. In still another embodiment, as shown in FIG. 5, the restraining member 116 may substantially enclose the heat exchanger 114 within the restraining member 116.

In yet another embodiment, one or more portions of the baseplate 18 may have a non-uniform thickness. For instance, in one embodiment, the baseplate 18 may be thicker at the center 42 and thinner at the edges 45 or periphery. This may cause the baseplate 18 to bow outward when the baseplate 18 tries to expand against the restraining member 16, which may create an uneven distribution of stress in the baseplate 18. This may result in substantial compression stress in the bottom baseplate surface 47 which is closest to the solar cell 12 causing the solar cell 12 to experience close to zero stress. On other surfaces of the baseplate 18, such as the upper baseplate surface 49 where the heat pipe 20 is attached, the tension bending stress may result in the stress being close to zero, which may be advantageous for the collar 25 and heat pipe 20 attachment to the baseplate 18. In such manner, the stress on the solar cell 12 and the heat pipe 20 may be reduced. In another embodiment, the baseplate 18 may have a uniform thickness.

Figure 6:
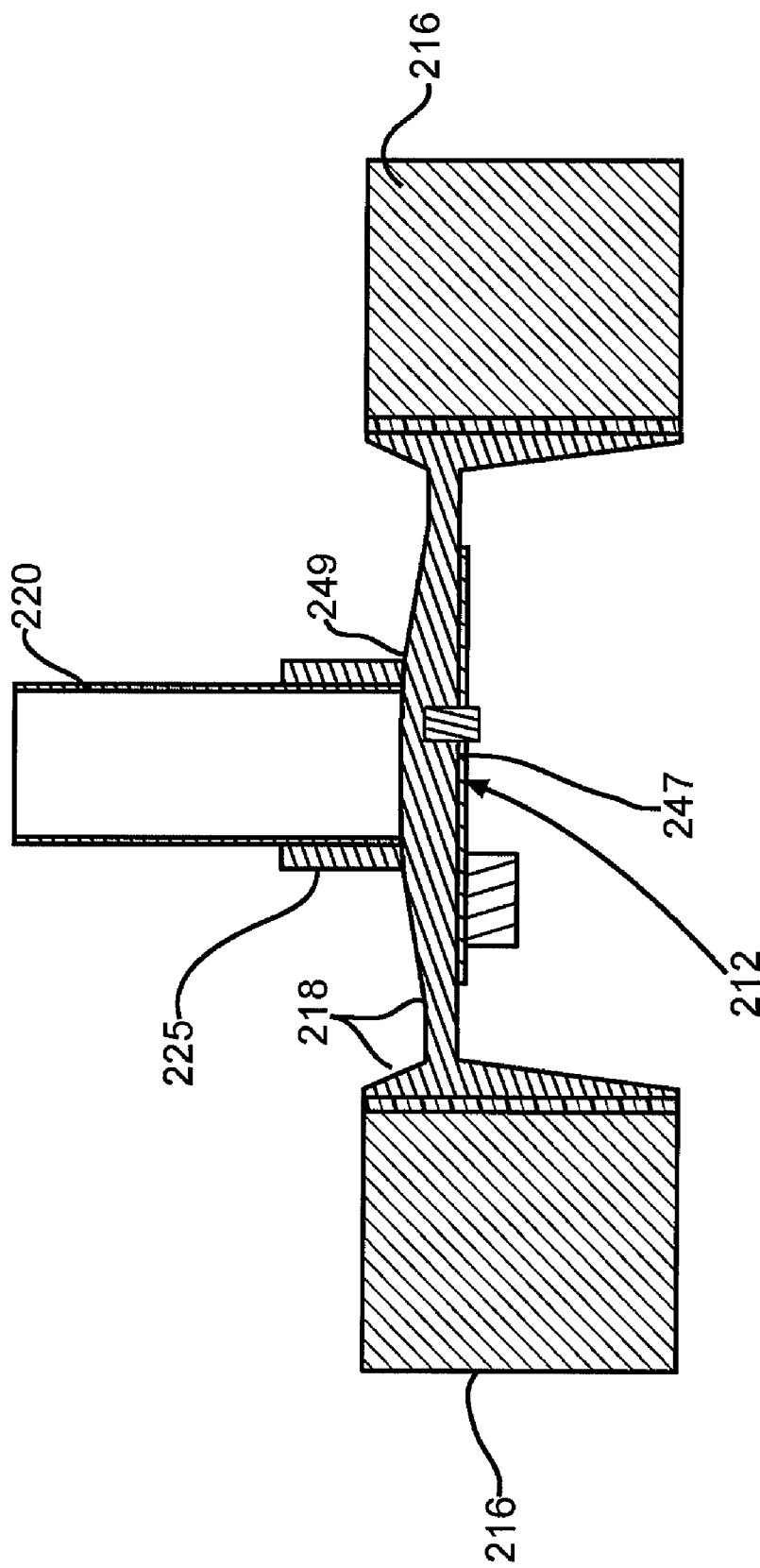
FIG. 6 shows a cross-section view of still anther embodiment of a solar collector.

In still another embodiment, as shown in FIG. 6, the baseplate 218 and the restraining member 216 may be attached in an eccentric, uneven manner. In this alignment, since the baseplate 218 and the restraining member 216 do not precisely line up, as the baseplate 218 expands and presses against the restraining member 216, the restraining member 216 may twist. This twisting may induce a moment into the baseplate 218 causing it to curve. This may create an uneven distribution of stress in the baseplate 218. For instance, the bottom baseplate surface 247 may experience substantial compression stress causing the solar cell 212 to experience close to zero stress. On other surfaces of the baseplate 218, such as the upper baseplate surface 249, the tension bending stress may result in the stress being close to zero, which may be advantageous for the collar 225 and heat pipe 220 attachment to the baseplate 218. In still other embodiments, both the thicknesses of the baseplate 218 may be varied, and the baseplate 218 and the restraining member 216 may be aligned in various manners, to achieve the desired stress distribution.

Figure 7:
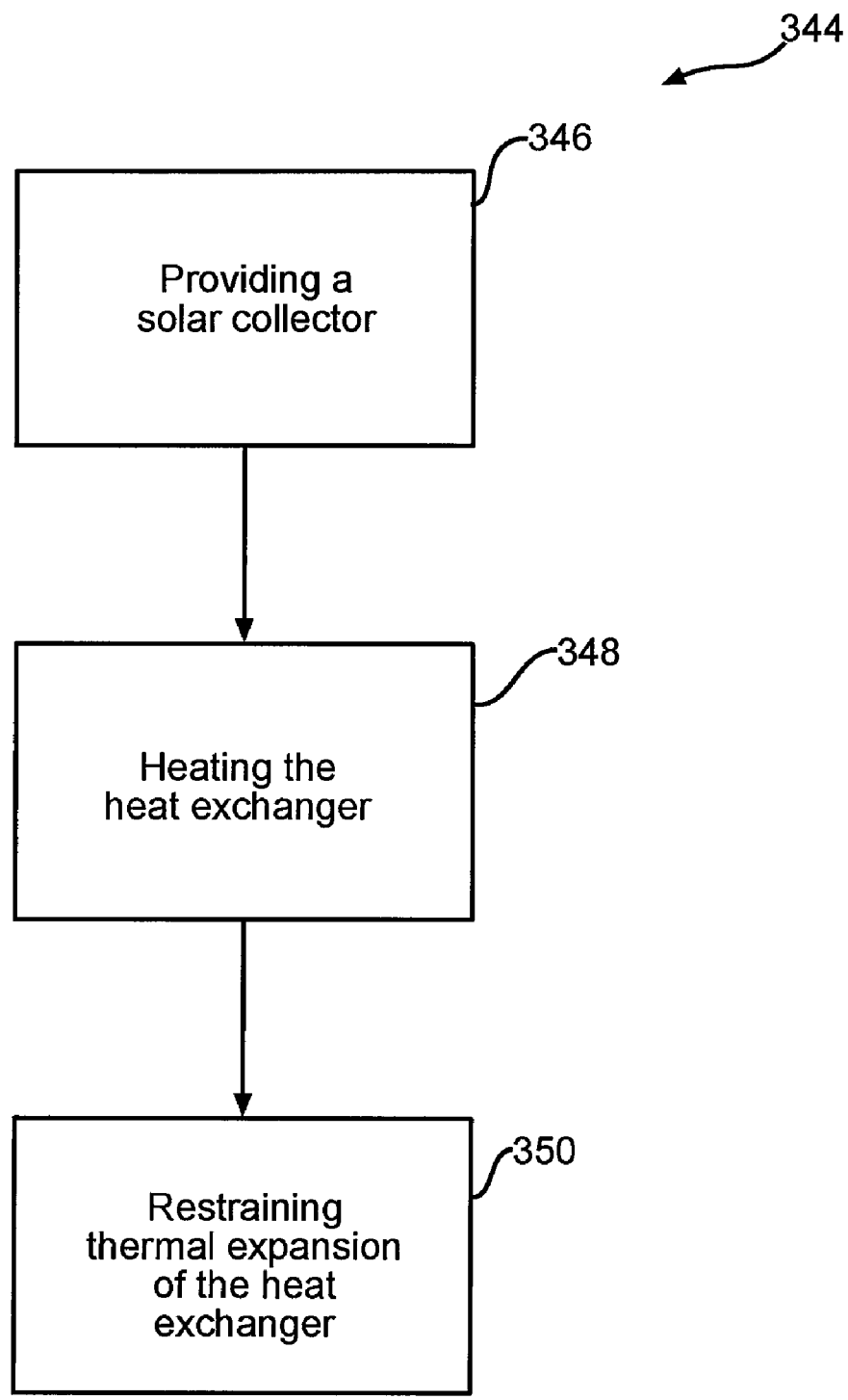
FIG. 7 is a flowchart showing one embodiment of a method of at least partly restraining the thermal expansion of a solar collector.

FIG. 7 shows a flowchart of an embodiment 344 of a method of at least partly restraining the thermal expansion of a solar collector 10. In one step 346, a solar collector 10 may be provided. The solar collector 10 may comprise a solar cell 12 attached with a heat exchanger 14, and a restraining member 16 attached over a perimeter 40 of the heat exchanger 14. The solar collector 10, including the solar cell 12, the heat exchanger 14, and the restraining member 16, may comprise any of the embodiments disclosed in this disclosure. In another step 348, the heat exchanger 14 may be heated. In still another step 350, thermal expansion of the heat exchanger 14 may be at least partly restrained due to the restraining member 16. The restraining member 16 may have a substantially high stiffness and a substantially low coefficient of thermal expansion in order to at least partly restrain thermal expansion of the heat exchanger 14. The restraining member 16 may at least partly restrain thermal expansion of the heat exchanger 14 so that it expands a substantially same amount as the solar cell 12 of the solar collector 10.

It should be understood, of course, that the foregoing relates to exemplary embodiments of the disclosure and that modifications may be made without departing from the spirit and scope of the disclosure as set forth in the following claims.

The invention claimed is:

1. A method of at least partly restraining thermal expansion of a solar collector comprising:
    providing a solar collector comprising a solar cell attached to a heat exchanger in a manner so that when the heat exchanger thermally expands the solar cell expands a substantially same amount as the heat exchanger, and a restraining member attached to the heat exchanger;
    heating the heat exchanger; and
    at least partly restraining thermal expansion of the heat exchanger with the restraining member so that the heat exchanger expands the substantially same amount as the solar cell.

2. The method of claim 1 wherein the solar cell is soldered to a metal layer.

3. The method of claim 2 wherein the metal layer is a copper layer.

4. The method of claim 2 wherein the metal layer is deposited onto a substrate layer.

5. The method of claim 4 wherein the substrate layer is an Alumina substrate.

6. The method of claim 4 wherein another metal layer is deposited onto the substrate layer.

7. The method of claim 6 wherein the another metal layer is soldered to the heat exchanger.

8. The method of claim 1 wherein the solar cell is germanium.

9. The method of claim 1 wherein the restraining member is attached around a perimeter of the heat exchanger.

10. The method of claim 9 wherein the heat exchanger is copper.

11. The method of claim 1 wherein the solar cell is attached to one or more layers and at least one of the one or more layers is attached to the heat exchanger.

12. The method of claim 1 wherein the restraining member comprises a girdle member.

13. The method of claim 1 wherein the restraining member is at least one of FeNi36, steel, a nickel alloy, or a carbon composite.

14. The method of claim 1 wherein the restraining member has a substantially high stiffness and a substantially low coefficient of thermal expansion in order to at least partly restrain thermal expansion of the heat exchanger.

15. The method of claim 1 wherein the heat exchanger comprises a baseplate, and the restraining member at least partly restrains thermal expansion of the baseplate so that the baseplate expands the substantially same amount as the solar cell.

16. The method of claim 1 wherein the restraining member comprises an exterior surface, an interior surface, and is defined by an inner hole, wherein the interior surface is attached around the perimeter of the heat exchanger.

17. The method of claim 1 wherein the heat exchanger is of a non-uniform thickness, and the solar cell experiences substantially zero stress during the thermal expansion of the heat exchanger.

18. The method of claim 1 wherein the heat exchanger is attached to the restraining member unevenly, and the solar cell experiences substantially zero stress during the thermal expansion of the heat exchanger.

19. The method of claim 1 wherein at least a portion of the heat exchanger has at least one opening so that it is not continuous, and the heat exchanger is substantially prevented from developing hoop compression.

20. The method of claim 1 wherein the solar cell, the heat exchanger, and the restraining member are made of differing materials having coefficients of thermal expansion which, due to the restraining member at least partly restraining the thermal expansion of the heat exchanger, cause the heat exchanger to expand the substantially same amount as the solar cell.

21. The method of claim 20 wherein the solar cell is made of germanium, the heat exchanger is made of copper, and the restraining member is made of at least one of FeNi36, steel, a nickel alloy, or a carbon composite.

22. The method of claim 20 wherein the coefficient of thermal expansion of the restraining member is less than the coefficient of thermal expansion of the solar cell, and the coefficient of thermal expansion of the solar cell is less than the coefficient of thermal expansion of the heat exchanger.

23. The method of claim 1 wherein the solar cell is soldered to the heat exchanger.

24. The method of claim 23 wherein the solar cell is soldered to a layer which is attached to one or more additional layers, with at least one of the one or more additional layers being soldered to the heat exchanger.

25. The method of claim 1 wherein the heat exchanger comprises a baseplate attached to a heat pipe.

26. The method of claim 1 wherein the restraining member surrounds a perimeter of the heat exchanger.

27. A method of at least partly restraining thermal expansion of a solar collector comprising:
    providing a solar collector comprising a solar cell attached to a baseplate of a heat exchanger in a manner so that when the baseplate thermally expands the solar cell expands a substantially same amount as the baseplate, and a restraining member attached to and surrounding a perimeter of the baseplate, wherein the restraining member has a coefficient of thermal expansion which is less than a coefficient of thermal expansion of the solar cell, and the coefficient of thermal expansion of the solar cell is less than a coefficient of thermal expansion of the baseplate;
    heating the baseplate; and
    at least partly restraining thermal expansion of the baseplate with the restraining member so that the baseplate expands the substantially same amount as the solar cell.

28. The method of claim 27 wherein the solar cell is made of germanium, the baseplate is made of copper, and the restraining member is made of at least one of FeNi36, steel, a nickel alloy, or a carbon composite.

* * * * *